United States Patent [19]

Krawczak

[11] Patent Number: 5,425,040
[45] Date of Patent: Jun. 13, 1995

[54] SWITCHING REGULATOR CONTROL FOR A LASER DIODE

[75] Inventor: John A. Krawczak, Minnetonka, Minn.

[73] Assignee: Unisys Corporation, Blue Bell, Pa.

[21] Appl. No.: 233,575

[22] Filed: Apr. 26, 1994

[51] Int. Cl.$^6$ .............................................. H01S 3/133
[52] U.S. Cl. ........................................ 372/38; 372/31; 363/74; 323/282
[58] Field of Search .......................... 372/38, 29–31; 363/19, 76, 79, 74; 323/282, 285

[56] References Cited

U.S. PATENT DOCUMENTS

| | | | |
|---|---|---|---|
| 4,092,710 | 5/1978 | Wadsworth | 363/19 |
| 4,369,525 | 1/1983 | Breton et al. | 455/618 |
| 5,157,676 | 10/1992 | Wilcox | 372/29 |

FOREIGN PATENT DOCUMENTS 0101783 4/1990 Japan ................................. 372/30

OTHER PUBLICATIONS

National Semiconductor Publication, Sep. 1992, pp. 1–20.

Primary Examiner—Rodney B. Bovernick
Assistant Examiner—Robert M. Nutt
Attorney, Agent, or Firm—Glenn W. Bowen; Mark T. Starr

[57] ABSTRACT

The present invention utilizes the advantages of a switching regulator, such as, for example, the one shown in the National Semiconductor September 1992 publication, without the addition of additional complex control circuitry to provide a highly efficient controller for controlling the average optical output from a laser diode.

6 Claims, 3 Drawing Sheets

SWITCHING REGULATOR CONTROL FOR A LASER DIODE

FIELD OF THE INVENTION

This invention relates to the control of a power supply for regulating the light output from a laser diode, and more particularly it relates to a laser diode control circuit which employs a switching voltage regulator for high efficiency operation.

BACKGROUND OF THE INVENTION

The use of laser diodes for information storage and retrieval and for fiber optics applications is rapidly increasing. The compact size, brightness and switching rate of a laser diode are its greatest advantages.

A DC-to-DC converter power supply for a helium neon gas laser which is coupled directly to the laser is shown in U.S. Pat. No. 4,092,710, issued May 30, 1978 to Gary Earl Wadsworth, entitled "Laser Power Supply." The converter includes a power transistor which is subject to control of its on-time to provide constant current regulation.

U.S. Pat. No. 5,157,676, issued Oct. 20, 1992 to Russell B. Wilcox, which is entitled "Apparatus and Process for Active Pulse Intensity Control of Laser Beam," is another control scheme for a pulsed laser source in which the light beam from the laser is passed to a beamsplitter. A portion of the beam is tapped-off from the beamsplitter and supplied to a photo-detector circuit, which controls the output of the power supply. The power supply is coupled to a light intensity control device which is responsive to the voltage from the power supply. The beam from the pulse laser source passes through the light intensity control device in accordance with the regulation supplied by the photo-detector.

U.S. Pat. No. 4,369,525, issued Jan. 18, 1983 to Jean P. Breton, et al., entitled "Device for Automatic Regulation of the Output Power of a Transmitter Module in an Optical-Fiber Transmission System," discloses a device for automatically regulating the output power of a transmitter module in an optical-fiber transmission system. In this system a laser diode is positioned so that a portion of its output is coupled to a photodiode for control purposes. Current through the laser diode in this system consists of a direct or nominal current and a modulating current. A separate temperature sensor is included in the system for sensing temperature changes for controlling the nominal current.

The prior art regulation and control circuits have relatively low efficiencies. Switching power supply for laser diodes can improve the system electrical efficiency, particularly at high temperature. Until recently, however, switching voltage regulators were relatively too large in size for many applications. Recently, integrated switching regulator circuits in small integrated circuit packages have become available which open many new possibilities for the use of laser diodes. One such switching voltage regulator was announced by National Semiconductor in a brochure with a publication date of September 1992. National Semiconductor offered this switching regulator under the designations LM2574/LM2574HV under the trademark "Simple Switcher." This device is capable of driving a 0.5 amp load with output voltages of 3.3 volts, 5 volts, 12 volts, 15 volts and with an adjustable output voltage.

The switching voltage regulator is supplied in two types of packages, an 8-lead DIP package and a 14-lead surface mount package. In both packages 6 leads are utilizable for operation and control of the regulator. The remaining leads have no internal connection, but are soldered to a PC board to improve heat transfer. With these leads soldered to the printed circuit board, the copper traces on the printed circuit board are normally the only sinking that is needed because of the high efficiency of the regulator. In addition, small external components are required, and the regulator, as is common with switching regulators, includes internal frequency compensation. The active pins include a voltage input pin and voltage output pin, a separate signal and power ground pin, an on/off control pin for activating and deactivating the regulator and a feedback pin for supplying a feedback control signal to the regulator. National Semiconductor's Simple Switcher voltage regulator is only one of a number of regulators which may be employed to implement the present invention.

A fixed voltage version of the National Semiconductor voltage regulator is taught by the September 1992 publication. This version is illustrated in FIG. 1. Unregulated DC input voltage is supplied across the input capacitance $_{in}$ to pin 5 of the voltage or $V_{in}$ pin. This pin is coupled to an internal regulator which in turn is coupled to an on/off switch for external switching of the power supply off and on. In the 6-voltage version found in the publication, pin 3 is grounded to the same ground as the signal ground of pin 2. A separate power ground pin 4 is provided which may be coupled to the same ground as the signal ground pin 2. The output of the circuit is supplied on the pin 7. Suitable elements, such as a Schottky diode D1, the series inductance L1 and the output capacitance $C_{out}$ are coupled to pin 7 to provide the final regulated output to 0.5 amp load. capacitance $C_{out}$ and L1 to provide a feedback control In the fixed voltage version, the feedback terminal pin 1 is coupled to the junction of the signal regulating the output current through the load. The feedback pin 1 is connected to an internal resistor which in turn is connected to an internal resistor R1 which is equal to a reference voltage at the other end. The junction point of the resistors R2 and R1 is coupled to the non-inverting input of a fixed gain error amplifier. The other input of the error amplifier is coupled to a 1.23 volt band gap reference level. The output of a fixed gain amplifier is connected to the non-inverting input of a comparator. The inverting comparator is connected to a 52 kHz oscillator.

The output of the comparator is connected to an OR gate the other input of which is connected to a reset circuit. The output of a NOR gate is connected to a driver which has current limiting and thermal shut-down control. The output of the driver is connected to a NPN emitter-coupled transistor a collector of which is coupled to receive the voltage input signal from pin 5, and the emitter of which is coupled to supply the output current to pin 7. Utilization of this fixed voltage version as shown with the laser diode as the load does not provide a desirable implementation. This fixing of the voltage across the laser diode does not provide satisfactory control of the output of the diode when temperature variations occur which is characteristic of laser diodes.

FIG. 2 is an adjustable voltage version, as taught by the September 1992 National Semiconductor publication. In this version the resistors R3 and R4 are added with R3 coupled to the load and R4 connected to ground, and the junction point between R3 and R4 is supplying the take-off point for the feedback that is supplied to pin 1. Variation in the ratio between R3 and R4 determines the amount of voltage that is fed back. With this implementation, the input voltage may undergo a wide variation. However, utilization of a laser diode that has a load that conflicts with this circuit again is not satisfactory since adjusting the output voltage is not determined by the output of the laser diode, but is determined by the ratio of the resistors R3 and R4.

SUMMARY OF THE INVENTION

The optical output of a laser diode is regulated by a DC-to-DC switching voltage regulator that has voltage-in, voltage-out and feedback terminals and circuitry for providing a regulated DC output voltage on the voltage-out terminal which is derived from a DC input voltage on the voltage-in terminal. The regulating elements are coupled to the voltage-out terminal and to the load terminal to supply regulated electrical output signals to the laser diode. A photo-detector diode is coupled to a second reference voltage point and to the feedback terminal such that the photo-detector diode is positioned to sample the optical output of said laser diode. A resistor is coupled to the voltage-in terminal and the feedback terminal. The value of the resistor is determined by the optoelectric and thermal characteristics of the laser diode, (i.e., light output at a given voltage and temperature), and the photodetector diode (i.e. diode current), wherein the variation of the optical output of said laser diode as a function of temperature is minimized.

BRIEF DESCRIPTION OF THE DRAWINGS

The present invention is described by reference to the drawings in which.

DETAILED DESCRIPTION OF THE INVENTION

Probably the most common method that is now in use for laser optical power control is linear regulation. With this method a transistor in series with a laser is controlled by a feedback loop to provide constant optical output from the laser. With high temperatures the laser current becomes high, and the dissipation of the pass transistor also becomes high because typical power supplies for such control circuits generally provide a much higher voltage than the laser diode drop of 1.3 to 2 volts. In typical designs the dissipation of the pass transistor may be close to 50% of the total dissipation. In addition, such power supplies often require many analog components. In contrast, integrated circuit switching regulators may be 80% efficient or more, but only 20% of the dissipation is not taken up by the laser diode load.

Figure 1:
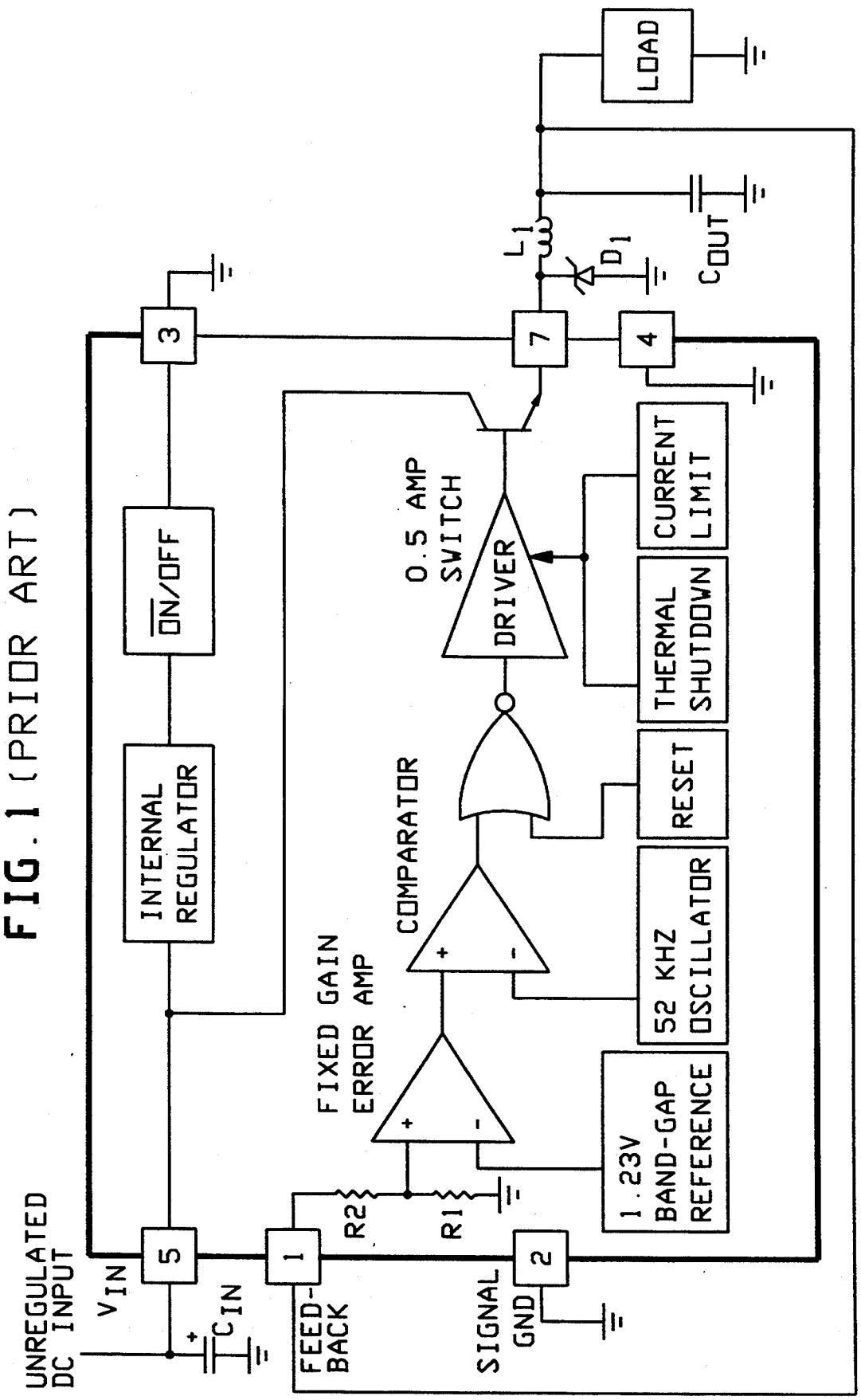
FIG. 1 is a block diagram and schematic which illustrates a prior art voltage switching regulator in a fixed voltage mode.
Figure 2:
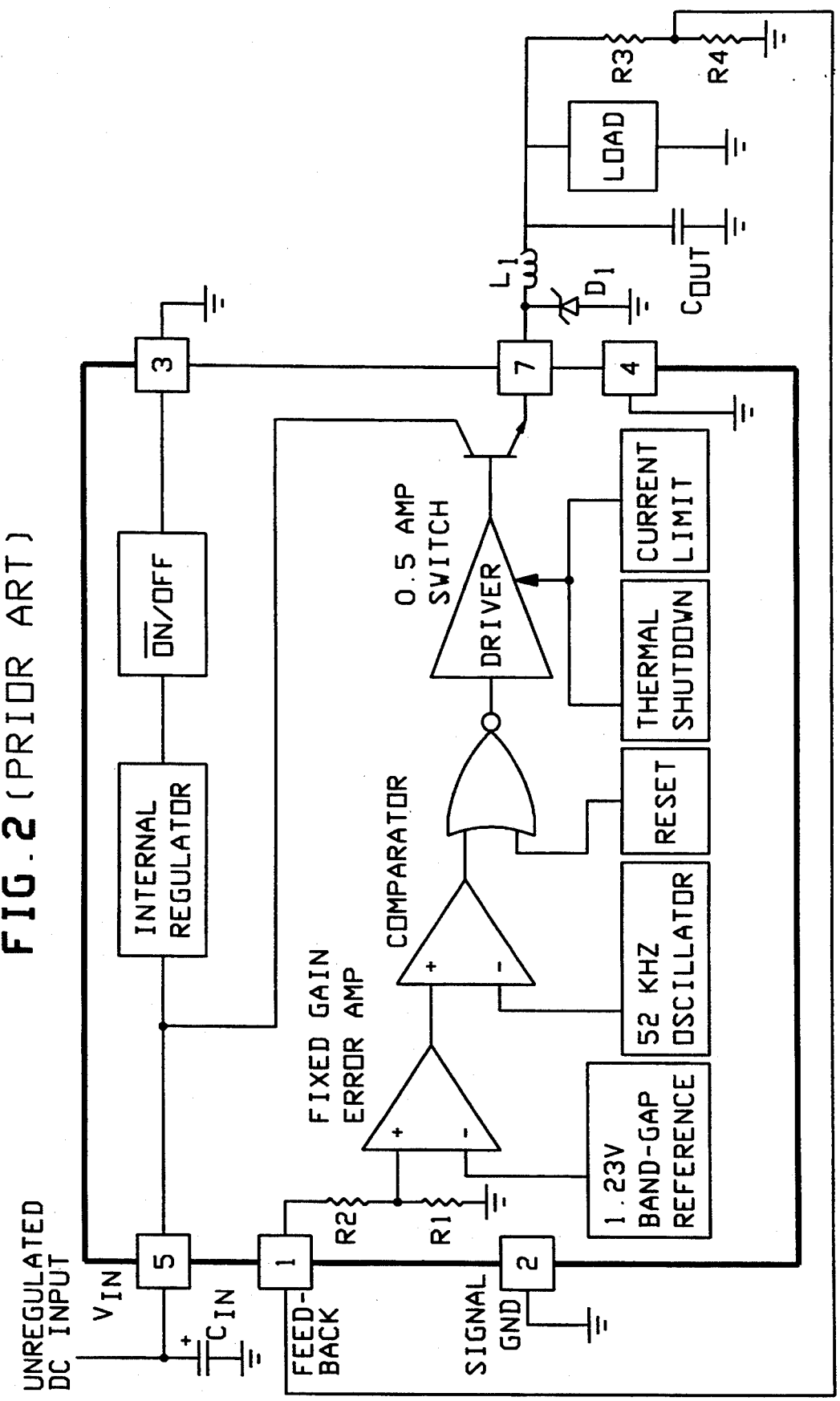
FIG. 2 is a block diagram and schematic of the switching voltage regulator of FIG. 1 configured in an adjustable voltage mode.
Figure 3:
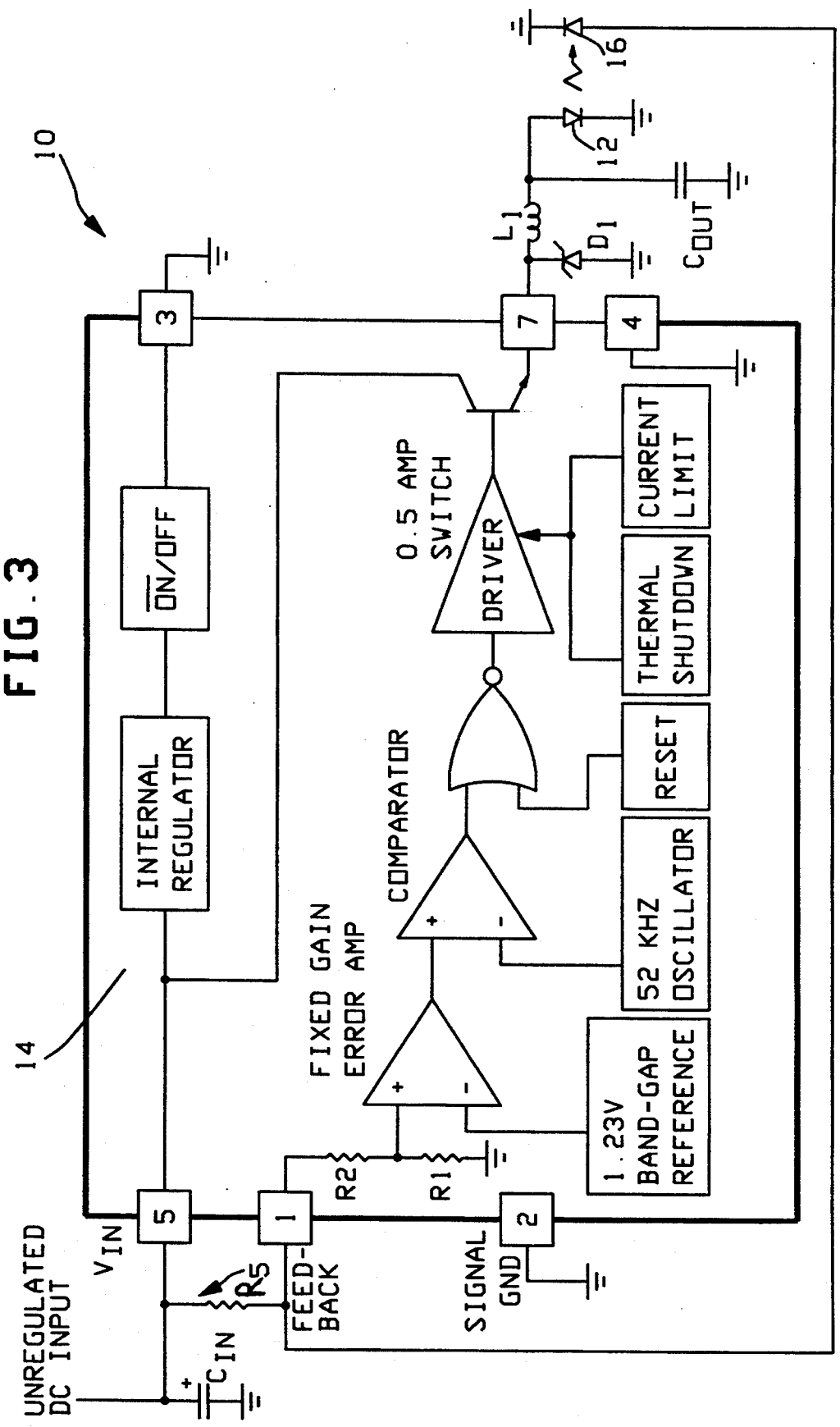
FIG. 3 is a block diagram representation of a laser diode control circuit of the present invention.

The control circuit for controlling the output of a laser diode 12 as shown in FIG. 3 is an embodiment that uses a buck-switching regulator which has at least external pin connections for PC input, output and feedback. Laser diode packages are commonly provided with a photodiode detector that is built into the laser package and is positioned so as to intercept the back-facet laser diode emission. The present invention can, therefore, be implemented in its simplest form with an integrated circuit switching regulator, such as the National Semiconductor LM2574 regulator, and a purchased laser diode with a built-in photodiode detector by the addition of a resistor R5 which is coupled between the DC input, pin 5 and feedback pin 1. Resistor R5 is connected to provide reverse bias to the photodiode and feedback to the regulator.

With the connections shown, the current flowing through the photodiode 16 is, therefore, determined by the amount of light that is received by the photodiode 16 from the laser diode 12, since the photodiode 16 acts as a current source in accordance with the amount of light that is received from the laser diode 12. The voltage drop across resistor R5 determines the input to the non-inverting terminal of the fixed gain error amplifier inside the switching regulator. The photodetector diode 16 in the described embodiment is coupled to ground at its cathode side, as is the cathode of the laser diode 12. However, the photodetector diode could be coupled to another reference voltage point, if desired. The input on the non-inverting input terminal is compared to the 1.23 v band-gap reference to provide the variable control required to keep the output from the laser diode 12 at a substantially constant level.

While the photodetector is supplied current through the resistor R5 from the laser diode, the optical output of the laser diode 12 is maintained within its desired light output range because the value of the resistor R5 is selected using Ohm's law and the laser diode and photodiode specifications that are supplied with the laser diode package. In addition, laser threshold changes with temperature are controlled by the method.

The use of the photodiode and resistor R5 to establish the operating point for the laser provides highly efficient laser optical power control.

While the invention has been described with reference to an embodiment that utilizes a currently available switching regulator, the invention will be applicable to, and may be implemented with, a variety of switching regulators. It is, therefore, intended that the claims encompass the utilization of such switching regulators in the implementation of the claimed invention.

I claim:

1. A circuit for regulating the optical output of a laser diode comprising,
   (a) first and second reference voltages,
   (b) a load terminal,
   (c) a DC-to-DC switching voltage regulator means comprising a voltage-in terminal for receiving a DC input voltage means which is operated by a single DC input voltage, a voltage-out terminal and a feedback terminal and circuitry for providing a DC output voltage on the voltage-out terminal,
   (d) regulating means coupled between said voltage-out terminal and said load terminal for supplying regulated electrical output signals to said laser diode wherein said laser diode is coupled between said load terminal and said first reference voltage,
   (e) a photodetector diode coupled between said second reference voltage and said feedback terminal, and positioned to sample the optical output of said laser diode, and
   (f) a resistor coupled across said voltage-in terminal and said feedback terminal.

2. A circuit as claimed in claim 1 wherein said second reference voltage to which said photodetector diode is coupled is at the same voltage as said first reference voltage to which said laser diode is coupled.

3. The circuit as claimed in claim 1 wherein said DC-to-DC switching voltage regulator means includes an error comparator means and an internal reference voltage which compares said internal reference voltage with the voltage at the feedback terminal and provides an error output signal in response to the difference between said first reference voltage and said voltage at said feedback terminal voltage which controls said DC output voltage of said DC-to-DC switching voltage regulator means in correspondence with said difference between said voltages, wherein the value of said resistor is calculated using Ohm's law and the values of said voltage at said voltage-in terminal, said internal reference voltage and the current that flows through the photo detector diode when said laser diode is providing a light output of a predetermined amount.

4. A circuit as claimed in claim 3 wherein said light output of said laser diode of said predetermined amount which occurs at a selected voltage and temperature provides current through the photodiode such that the error comparator supplies a zero error output signal.

5. A circuit as claimed in claim 3 wherein said second reference voltage to which said photodetector diode is coupled is at the same voltage level as said first reference voltage to which said laser diode is coupled.

6. A circuit as claimed in claim 5 wherein said light output of said laser diode of said predetermined amount occurs at a selected voltage and temperature provides current through the photodiode such that the error comparator supplies a zero error output signal.

* * * * *

UNITED STATES PATENT AND TRADEMARK OFFICE
CERTIFICATE OF CORRECTION

PATENT NO. : 5,425,040
DATED : June 13, 1995
INVENTOR(S) : John A. Krawczak

It is certified that error appears in the above-indentified patent and that said Letters Patent is hereby corrected as shown below:

Column 2 line 25, "$_{in}$" should be -- $C_{in}$ -- .

Column 2 lines 36 and 37, delete "capacitance $C_{out}$ and L1 to provide a feedback control".

Column 2 line 39, before "signal" insert -- capacitance $C_{out}$ and L1 to provide a feedback control -- .

Signed and Sealed this

Tenth Day of October, 1995

Attest:

BRUCE LEHMAN

Attesting Officer      Commissioner of Patents and Trademarks

UNITED STATES PATENT AND TRADEMARK OFFICE
CERTIFICATE OF CORRECTION

PATENT NO. : 5,425,040
DATED : June 13, 1995
INVENTOR(S) : John A. Krawczak

It is certified that error appears in the above-indentified patent and that said Letters Patent is hereby corrected as shown below:

Column 5 line 11, delete "first" and substitutee-- internal--.

Signed and Sealed this

Second Day of January, 1996

Attest:

BRUCE LEHMAN

Attesting Officer        Commissioner of Patents and Trademarks